United States Patent
Chiu

(10) Patent No.: US 7,804,360 B2
(45) Date of Patent: Sep. 28, 2010

(54) DEAD-TIME LOCKING CIRCUIT

(75) Inventor: Chien-Hao Chiu, Yilan County (TW)

(73) Assignee: Advanced Analog Technology, Inc., Science-Based Industrial Park, Hsinchu (TW)

( * ) Notice: Subject to any disclaimer, the term of this patent is extended or adjusted under 35 U.S.C. 154(b) by 73 days.

(21) Appl. No.: 12/326,047

(22) Filed: Dec. 1, 2008

(65) Prior Publication Data

US 2010/0085118 A1    Apr. 8, 2010

(30) Foreign Application Priority Data

Oct. 3, 2008    (TW) .............................. 97138089 A

(51) Int. Cl.
*H03F 3/217*    (2006.01)
(52) U.S. Cl. .................... 330/251; 330/207 A
(58) Field of Classification Search ............ 330/207 A, 330/251
See application file for complete search history.

(56) References Cited

U.S. PATENT DOCUMENTS 7,298,209 B1 * 11/2007 Sutardja ..................... 330/251

* cited by examiner

*Primary Examiner*—Khanh V Nguyen
(74) *Attorney, Agent, or Firm*—Winston Hsu; Scott Margo; Min-Lee Teng

(57) ABSTRACT

The dead-time locking circuit includes phase detector and a delay-comparator. The delay-comparator includes two input ends for receiving phase adjusting signal and the input-exchanging signal received by the class D amplifier. After comparing, the delay-comparator outputs a gate driving signal. The phase detector detects the phase difference between the output signal of the class D amplifier and the gate driving signal of the power transistor of the class D amplifier, and accordingly adjusts the rising/falling edges of the gate driving signal outputted from and the comparator via the charge-pump. In this way, the dead-time can be locked at the predetermined value.

8 Claims, 4 Drawing Sheets

DEAD-TIME LOCKING CIRCUIT

BACKGROUND OF THE INVENTION

1. Field of the Invention

The present invention relates to a dead-time locking circuit, and more particularly, to a dead-time locking circuit applied to the class D amplifier.

2. Description of the Prior Art

The control of dead-time is vital for class D amplifiers. The conventional dead-time generator merely comprises logic gates so that the period of the dead-time cannot be locked. Hence the dead-time is easily affected by the process/temperature variation. If the generated dead-time is too short, the power transistors at the output stage of the class D amplifier are possibly turned on at the same time, which generates a large transient current and excessive heat, further causing the damage of the power transistors. Otherwise, if the dead-time is too long, the distortion of the output signal is increased. Furthermore, the over-long or over-short dead-times decrease the output efficiency of the class D amplifier. Therefore, in the design of the class D amplifier, the period of the dead-time is required to be designed appropriately and with low variation. In this way, the distortion of the output signal will not be deteriorated and the class D amplifier will not be damaged by being overheated.

SUMMARY OF THE INVENTION

The present invention provides a dead-time locking circuit for controlling a class D amplifier. The dead-time locking circuit comprises a first comparator, comprising a positive input end for receiving a threshold voltage; a negative input end for receiving a gate driving signal; and an output end for outputting a first comparing signal; wherein the first comparing signal results from comparing the threshold voltage and the gate driving signal; a second comparator, comprising a positive input end for receiving an output signal of the class D amplifier; a negative input end coupled to a first voltage source for receiving a first voltage; and an output end for outputting a second comparing signal; wherein the second comparing signal results from comparing the first voltage and the output signal of class D amplifier; a phase detector, comprising a first input end coupled to output end of the first comparator for receiving the first comparing signal; a second input end coupled to the output end of the second comparator for receiving the second comparing signal; a first output end for outputting a phase-leading signal; and a second input end for outputting a phase-lagging signal; wherein when phase of the first comparing signal leads the phase of second comparing signal, the phase detector outputs the phase-leading signal; when the phase of the first comparing signal lags the phase of the second comparing signal, the phase detector outputs the phase-lagging signal; a first and a second current sources for providing a first current; a first transistor, comprising a first end coupled to the first current source; a second end, and a control end coupled to the first output end of the phase detector; wherein when the first transistor receives the phase-leading signal, the first current is outputted at the second end of the first transistor; a second transistor, comprising a first end coupled to the second current source; a second end coupled to the second end of the first transistor; and a control end coupled to the second output end of the phase detector; wherein when the second transistor receives the phase-lagging signal, the first current is drained at the second end of the second transistor; a first capacitor coupled between the second end of the first transistor, the second end of the second transistor, and a second voltage source; a third current source for providing a second current; a second capacitor coupled between the third current source and the second voltage source; a third transistor, comprising a first end coupled to the second voltage source; a second end coupled to the third current source and the second capacitor; and a control end for receiving a switching control signal; wherein when the switching control signal turns the third transistor on, the second current source discharges the second capacitor through the third transistor; when the switching control signal turns the third transistor off, the third current source charges the second capacitor; and a third comparator, comprising a positive input end coupled to the second capacitor; a negative input end coupled to the first capacitor; an output end for outputting a switch control signal; wherein the switch control signal results from comparing voltages of the first capacitor and the second capacitor.

The present invention further provides a dead-time locking circuit for controlling a class D amplifier. The dead-time locking circuit comprises a falling dead-time locking circuit, comprising a first comparator, comprising a positive input end for receiving a first turning-on threshold voltage; a negative input end for receiving a first gate driving signal; and an output end for outputting a first comparing signal; wherein the first comparing signal results from comparing the first turning-on threshold voltage and the first gate driving signal; a second comparator, comprising a positive input end for receiving an output signal of the class D amplifier; a negative input end coupled to a first voltage source for receiving a first voltage; and an output end for outputting a second comparing signal; wherein the second comparing signal results from comparing the first voltage and the output signal of the class D amplifier; a phase detector, comprising a first input end coupled to output end of the first comparator for receiving the first comparing signal; a second input end coupled to the output end of the second comparator for receiving the second comparing signal; a first output end for outputting a phase-leading signal; and a second input end for outputting a phase-lagging signal; wherein when phase of the first comparing signal leads the phase of second comparing signal, the phase detector outputs the phase-leading signal; when the phase of the first comparing signal lags the phase of the second comparing signal, the phase detector outputs the phase-lagging signal; a first and a second current sources for providing a first current; a first transistor, comprising a first end coupled to the first current source; a second end; and a control end coupled to the first output end of the phase detector; wherein when the first transistor receives the phase-leading signal, the first current is outputted at the second end of the first transistor; a second transistor, comprising a first end coupled to the second current source; a second end coupled to the second end of the first transistor; and a control end coupled to the second output end of the phase detector; wherein when the second transistor receives the phase-lagging signal, the first current is drained at the second end of the second transistor; a first capacitor coupled between the second end of the first transistor, the second end of the second transistor, and a second voltage source; a third current source for providing a second current; a second capacitor coupled between the third current source and the second voltage source; a third transistor, comprising a first end coupled to the second voltage source; a second end coupled to the third current source and the second capacitor; and a control end for receiving an inverted signal of a switch control signal; wherein when the inverted signal of the switching control signal turns the third transistor on, the second current source discharges the second capacitor through the third transistor; when the inverted signal of the switching control signal turns the third transistor off, the third current source charges the second capacitor; and a third comparator, comprising a positive input end coupled to the second capacitor; a negative input end coupled to the first capacitor; an output end for outputting a result of comparing voltages respectively on the first capacitor and the second capacitor; and an inverter coupled to the output end of the third comparator for inverting a received signal as a first switch control signal; and a rising dead-time locking circuit, comprising a first comparator, comprising a negative input end for receiving a second turning-on threshold voltage; a positive input end for receiving a second gate driving signal; and an output end for outputting a first comparing signal; wherein the comparing signal results from comparing the second turning-on threshold voltage and the second gate driving signal; a second comparator, comprising a negative input end for receiving the output signal of the class D amplifier; a positive input end coupled to the second voltage source for receiving a second voltage; and an output end for outputting a second comparing signal; wherein the second comparing signal results from comparing the second voltage and the output signal of the class D amplifier; a phase detector, comprising a first input end coupled to output end of the first comparator for receiving the first comparing signal; a second input end coupled to the output end of the second comparator for receiving the second comparing signal; a first output end for outputting a phase-leading signal; and a second input end for outputting a phase-lagging signal; wherein when phase of the first comparing signal leads the phase of second comparing signal, the phase detector outputs the phase-leading signal; when the phase of the first comparing signal lags the phase of the second comparing signal, the phase detector outputs the phase-lagging signal; a first and a second current sources for providing a first current; a first transistor, comprising a first end coupled to the first current source; a second end; and a control end coupled to the first output end of the phase detector; wherein when the first transistor receives the phase-leading signal, the first current is outputted at the second end of the first transistor; a second transistor, comprising a first end coupled to the second current source; a second end coupled to the second end of the first transistor; and a control end coupled to the second output end of the phase detector; wherein when the second transistor receives the phase-lagging signal, the first current is drained at the second end of the second transistor; a first capacitor coupled between the second end of the first transistor, the second end of the second transistor, and the second voltage source; a third current source for providing the second current; a second capacitor coupled between the third current source and the second voltage source; a third transistor, comprising a first end coupled to the second voltage source; a second end coupled to the third current source and the second capacitor; and a control end for receiving a switching control signal; wherein when the switching control signal turns the third transistor on, the second current source discharges the second capacitor through the third transistor; when the switching control signal turns the third transistor off, the third current source charges the second capacitor; and a third comparator, comprising a positive input end coupled to the second capacitor; a negative input end coupled to the first capacitor; and an output end for outputting a result of comparing voltages respectively on the first capacitor and the second capacitor as a second switch control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
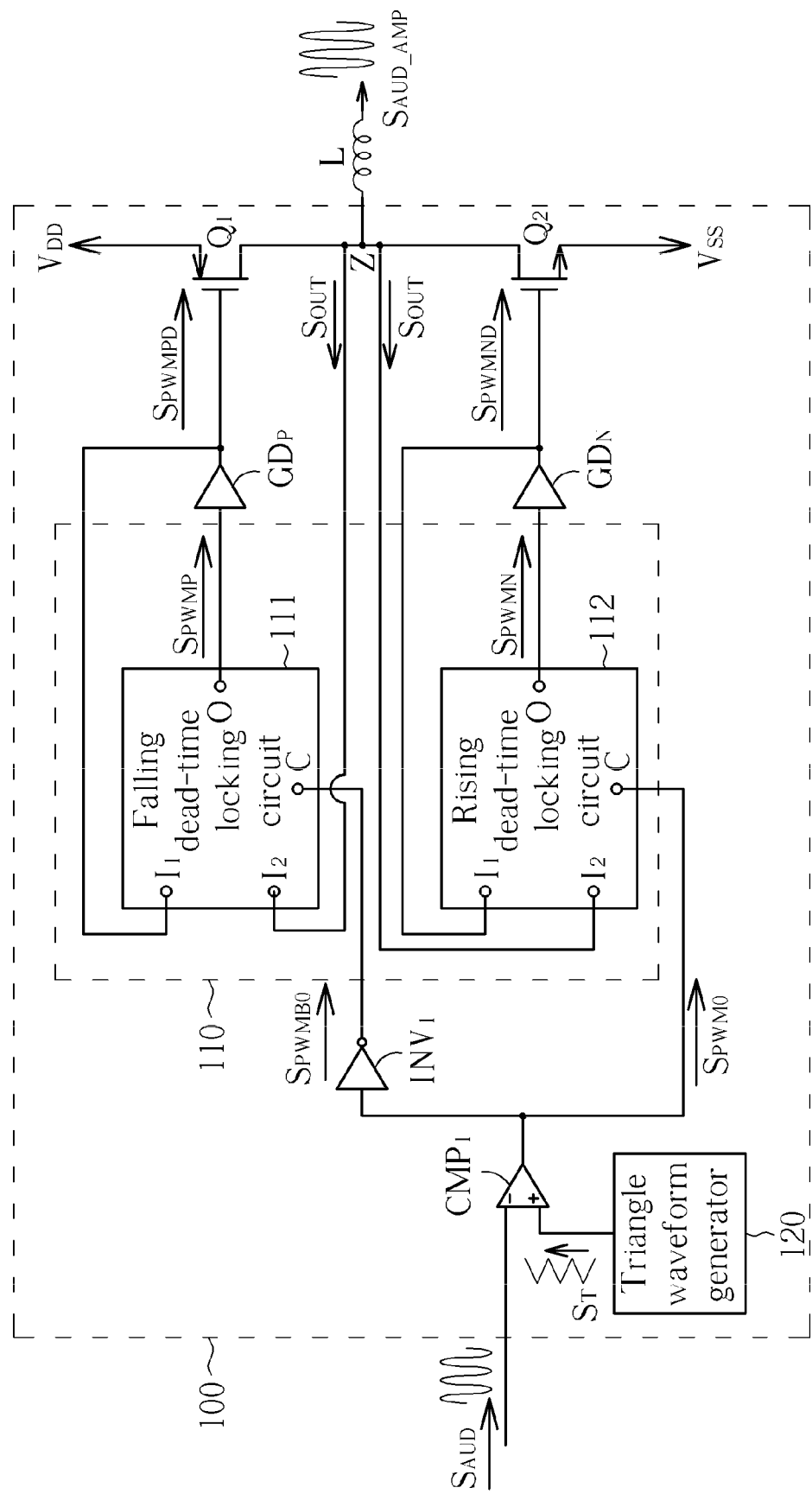
FIG. 1 is a diagram illustrating the class D amplifier of the present invention.

Please refer to FIG. 1. FIG. 1 is a diagram illustrating the class D amplifier 100 of the present invention. As shown in FIG. 1, the class D amplifier 100 is utilized to receive an audio signal $S_{AUD}$ and amplifying the received audio signal $S_{AUD}$. The audio signal amplified by the class D amplifier 100 is then outputted through the inductor L as the amplified audio signal $S_{AUD\_AMP}$.

The class D amplifier 100 comprises a dead-time locking circuit 110, a triangle waveform generator 120, a comparator $CMP_1$, an inverter $INV_1$, two gate driving circuits $GD_P$ and $GD_N$, and two power transistors $Q_1$ and $Q_2$. The power transistor $Q_1$ is a P-channel Metal Oxide Semiconductor (PMOS) transistor. The power transistor $Q_2$ is an N-channel Metal Oxide Semiconductor (NMOS) transistor. The source of the transistor $Q_1$ is coupled to a voltage source $V_{DD}$; the gate of the transistor $Q_1$ is coupled to the gate driving circuit $GD_P$ for receiving a gate driving signal $S_{PWMPD}$; the drain of the transistor $Q_1$ is coupled to the drain (node Z) of the transistor $Q_2$ for generating an output signal $S_{OUT}$. The source of the transistor $Q_2$ is coupled to a voltage source $V_{SS}$ (ground end); the gate of the transistor $Q_2$ is coupled to the gate driving circuit $GD_N$ for receiving the gate driving signal $S_{PWMND}$; the drain of the transistor $Q_2$ is coupled to the drain (node Z) of the transistor $Q_1$ for generating the output signal $S_{OUT}$.

The triangle waveform generator 120 is utilized to generate a triangle waveform signal $S_T$. The positive input end of the comparator $CMP_1$ is coupled to the triangle waveform generator 120 for receiving the triangle waveform signal $S_T$; the negative input end of the comparator $CMP_1$ is utilized to receive the audio signal $S_{AUD}$; the output end of the comparator $CMP_1$ is utilized to output a switching control signal $S_{PWM0}$ according to the result of the comparison of the triangle waveform signal $S_T$ and the audio signal $S_{AUD}$. The inverter $INV_1$ is coupled to the output end of the comparator $CMP_1$. The inverter receives the switching control signal $S_{PWM0}$, inverts the switching control signal $S_{PWM0}$, and outputs an inverted switching control signal $S_{PWMB0}$ accordingly.

The dead-time locking circuit 110 comprises a falling dead-time locking circuit 111 and a rising dead-time locking circuit 112.

The falling dead-time locking circuit 111 comprises two input ends $I_1$ and $I_2$, an output end O and a control end C. The input end $I_1$ of the falling dead-time locking circuit 111 is coupled to the output end of the gate driving circuit $GD_P$ for receiving the gate driving signal $S_{PWMPD}$; the input end $I_2$ of the falling dead-time locking circuit 111 is coupled to the node Z, for receiving the output signal $S_{OUT}$; the control end C of the falling dead-time locking circuit 111 is coupled to the output end of the inverter $INV_1$ for receiving the switching control signal $S_{PWMB0}$; the output end O of the falling dead-time locking circuit 111 is coupled to the input end of the gate driving circuit $GD_P$ for outputting the switch control signal $S_{PWMP}$.

The rising dead-time locking circuit 112 comprises two input ends $I_1$ and $I_2$, an output end O and a control end C. The input end $I_1$ of the rising dead-time locking circuit 112 is coupled to the output end of the gate driving circuit $GD_N$ for receiving the gate driving signal $S_{PWMND}$; the input end $I_2$ of the rising dead-time locking circuit 112 is coupled to the node Z for receiving the output signal $S_{OUT}$; the control end C of the rising dead-time locking circuit 112 is coupled to the output end of the comparator $CMP_1$ for receiving the switching control signal $S_{PWM0}$; the output end O of the rising dead-time locking circuit 112 is coupled to the input end of the gate driving circuit $GD_N$ for outputting the switch control signal $S_{PWMN}$.

The gate driving circuit $GD_P$ is coupled between the output end o of the falling dead-time locking circuit 111 and the gate of the transistor $Q_1$ for amplifying the switch control signal $S_{PWMP}$ received from the falling dead-time locking circuit 111 (amplifying the current or the voltage of the signal of the switch control signal $S_{PWMP}$) in order to generate the gate driving signal $S_{PWMPD}$, which is capable of turning the transistor $Q_1$ on.

The gate driving circuit $GD_N$ is coupled between the output end o of the rising dead-time locking circuit 112 and the gate of the transistor $Q_2$ for amplifying the switch control signal $S_{PWMN}$ received from the rising dead-time locking circuit 112 (amplifying the current or the voltage of the signal of the switch control signal $S_{PWMN}$) in order to generate the gate driving signal $S_{PWMND}$, which is capable of turning the transistor $Q_2$ on.

Additionally, all the signals $S_{PWM0}$, $S_{PWMB0}$, $S_{PWMP}$, $S_{PWMN}$, $S_{PWMPD}$, $S_{PWMND}$ and $S_{OUT}$ are Pulse Width Modulation (PWM) signals.

Figure 2:
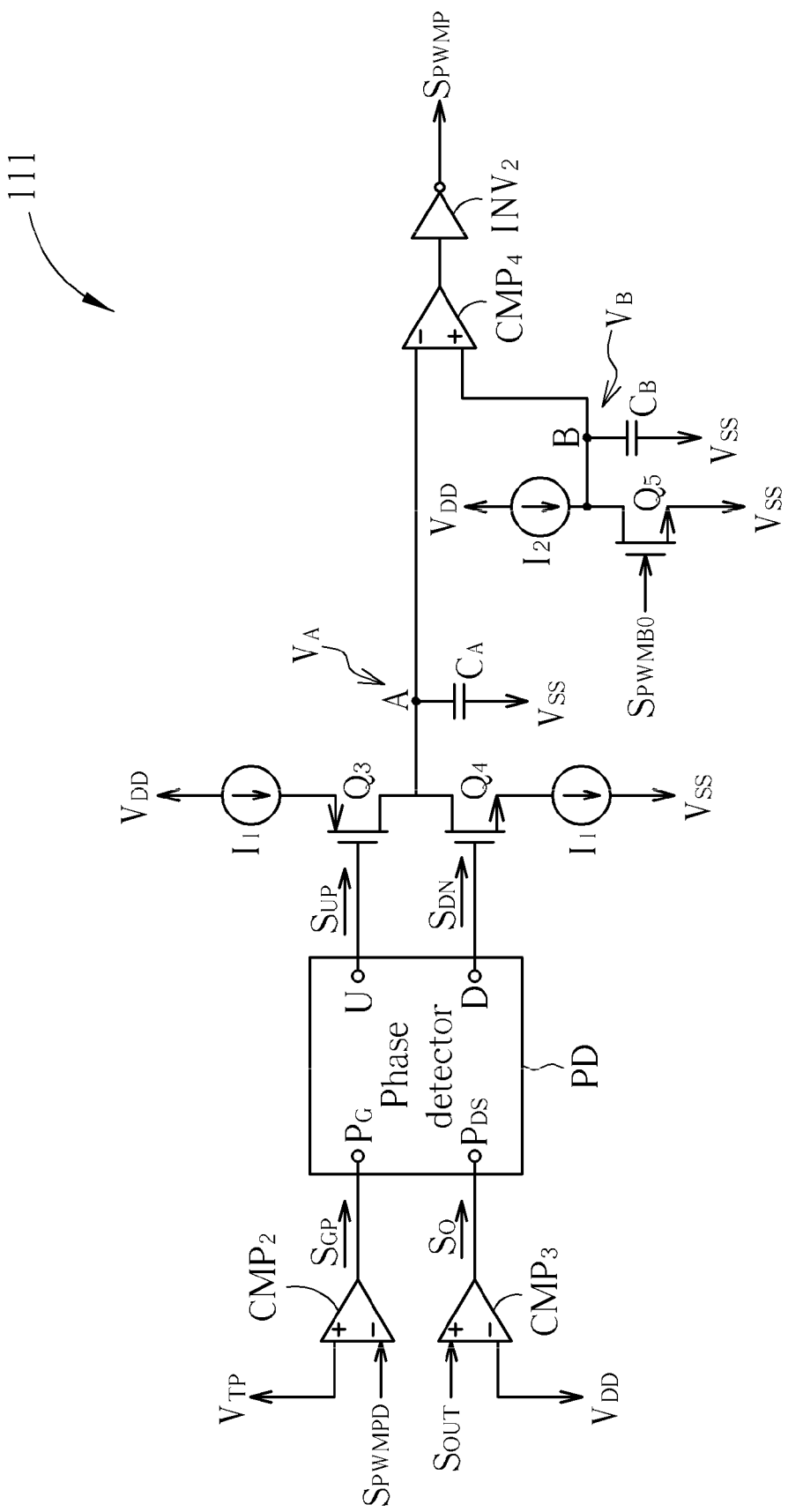
FIG. 2 is a diagram illustrating the falling dead-time locking circuit of the present invention.

Please refer to FIG. 2. FIG. 2 is a diagram illustrating the falling dead-time locking circuit 111 of the present invention. As shown in FIG. 2, the falling dead-time locking circuit 111 comprises three comparators $CMP_2$, $CMP_3$, and $CMP_4$, a phase detector PD, three transistors $Q_3$, $Q_4$, and $Q_5$, two current sources $I_1$ and $I_2$, two capacitors $C_A$ and $C_B$, and an inverter $INV_2$. The transistor $Q_3$ is a PMOS transistor; the transistors $Q_4$ and $Q_5$ are NOMS transistors.

The positive input end of the comparator $CMP_2$ is used to receive a threshold voltage $V_{TP}$; the negative input end of the comparator $CMP_2$ is coupled to the output end of the gate driving circuit $GD_P$ (not shown), for receiving the gate driving signal $S_{PWMPD}$; the output end of the comparator $CMP_2$ is coupled to the input end $P_G$ of the phase detector PD for generating the comparing signal $S_{GP}$ to the phase detector PD according to the result of the comparison of the signals received on the positive and negative input ends of the comparator $CMP_2$. The threshold voltage $V_{TP}$ is the threshold voltage of the transistor $Q_1$.

The negative input end of the comparator $CMP_3$ is coupled to the voltage source $V_{DD}$ for receiving the voltage $V_{DD}$ of the voltage source $V_{DD}$; the positive input end of the comparator $CMP_3$ is coupled to the node Z for receiving the output signal $S_{OUT}$; the output end of the comparator $CMP_3$ is coupled to the input end $P_{DS}$ of the phase detector PD for generating the comparing signal $S_O$ to the phase detector PD according to the result of the comparison of the signals received on the positive and negative input ends of the comparator $CMP_3$.

The phase detector PD comprises two input ends $P_G$ and $P_{DS}$, and two output ends U and D. The input end $P_G$ of the phase detector PD is coupled to the output end of the comparator $CMP_2$ for receiving the comparing signal $S_{GP}$; the input end $P_{DS}$ of the phase detector PD is coupled to output end of the comparator $CMP_3$ for receiving the comparing signal $S_O$; the output end U of the phase detector PD is coupled to the gate of the transistor $Q_3$ for outputting a phase-leading signal $S_{UP}$; the output end D of the phase detector PD is coupled to the gate of the transistor $Q_4$ for outputting a phase-lagging signal $S_{DN}$. When the phase of the comparing signal $S_{GP}$ leads the phase of the comparing signal $S_O$, the phase detector PD outputs the phase-leading signal $S_{UP}$ to the gate of the transistor $Q_3$; otherwise, when the phase of the comparing signal $S_{GP}$ lags the phase of the comparing signal $S_O$, the phase detector PD outputs the phase-lagging signal $S_{DN}$ to the gate of the transistor $Q_4$.

The source of the transistor $Q_3$ is coupled to the current source $I_1$; the gate of the transistor $Q_3$ is coupled to the output end U of the phase detector PD for receiving the phase-leading signal $S_{UP}$; the drain of the transistor $Q_3$ is coupled to the drain of the transistor $Q_4$ (node A). The source of the transistor $Q_4$ is coupled to the current source $I_1$; the gate of the transistor $Q_4$ is coupled to the output end D of the phase detector PD for receiving the phase-lagging signal $S_{DN}$; the drain of the transistor $Q_4$ is coupled to the drain of the transistor $Q_3$ (node A). The capacitor $C_A$ is coupled between the node A and the voltage source $V_{SS}$. When the transistor $Q_3$ receives the phase-leading signal $S_{UP}$, the transistor $Q_3$ is turned on for charging the capacitor $C_A$ with the current $I_1$ for raising the voltage $V_A$ of the node A; otherwise, when the transistor $Q_4$ receives the phase-lagging signal $S_{DN}$, the transistor $Q_4$ is turned on for discharging the capacitor $C_A$ with the current $I_1$ for lowering the voltage $V_A$ of the node A.

The gate of the transistor $Q_5$ is coupled to the output end of the inverter $INV_1$ for receiving the switching control signal $S_{PWMB0}$; the source of the transistor $Q_5$ is coupled to the voltage source $V_{SS}$; the drain of the transistor $Q_5$ is coupled between the node B and the current source $I_2$. The capacitor $C_B$ is coupled between the node B and the voltage source $V_{SS}$. When the transistor $Q_5$ is turned on by the switching control signal $S_{PWMB0}$, the capacitor $C_B$ is discharged by the transistor $Q_5$ so that the comparator $CMP_4$ outputs the signal with logic "0" for turning the transistor $Q_1$ off; otherwise, when the transistor $Q_5$ is turned off by the switching control signal $S_{PWMB0}$, the current source $I_2$ provides a constant current $I_2$ for charging the capacitor $C_B$ in order to raise the voltage $V_B$ of the node B with a constant speed so that the comparator $CMP_4$ outputs the signal with logic "1" for turning the transistor $Q_1$ on.

The negative input end of the comparator $CMP_4$ is coupled to the node A for receiving the voltage $V_A$ of the node A; the positive input end of the comparator $CMP_4$ is coupled to the node B for receiving the voltage $V_B$ of the node B; the output end of the comparator $CMP_4$ is coupled to the inverter $INV_2$ for outputting the result of the comparison of the voltages received on the positive and negative input ends of the comparator $CMP_4$. The inverter $INV_2$ inverts the signal received on the input end of the inverter $INV_2$, and outputs the inverted received signal as the switch control signal $S_{PWMP}$. The switch control signal $S_{PWMP}$ becomes the gate driving signal $S_{PWMPD}$ after being amplified by the gate driving circuit $GD_P$.

In this way, the dead-time locking circuit 111 is capable of detecting the phases of the gate driving signal $S_{PWMPD}$ and the output signal $S_{OUT}$ by the phase detector PD, and therefore adjusts the timing of occurrence of the output signal with logic "1" of the comparator $CMP_4$ by charging/discharging the capacitor $C_A$, which adjusts the timing of the falling edge of the gate driving signal $S_{PWMPD}$ and locks the falling dead-time to be a predetermined value.

Figure 3:
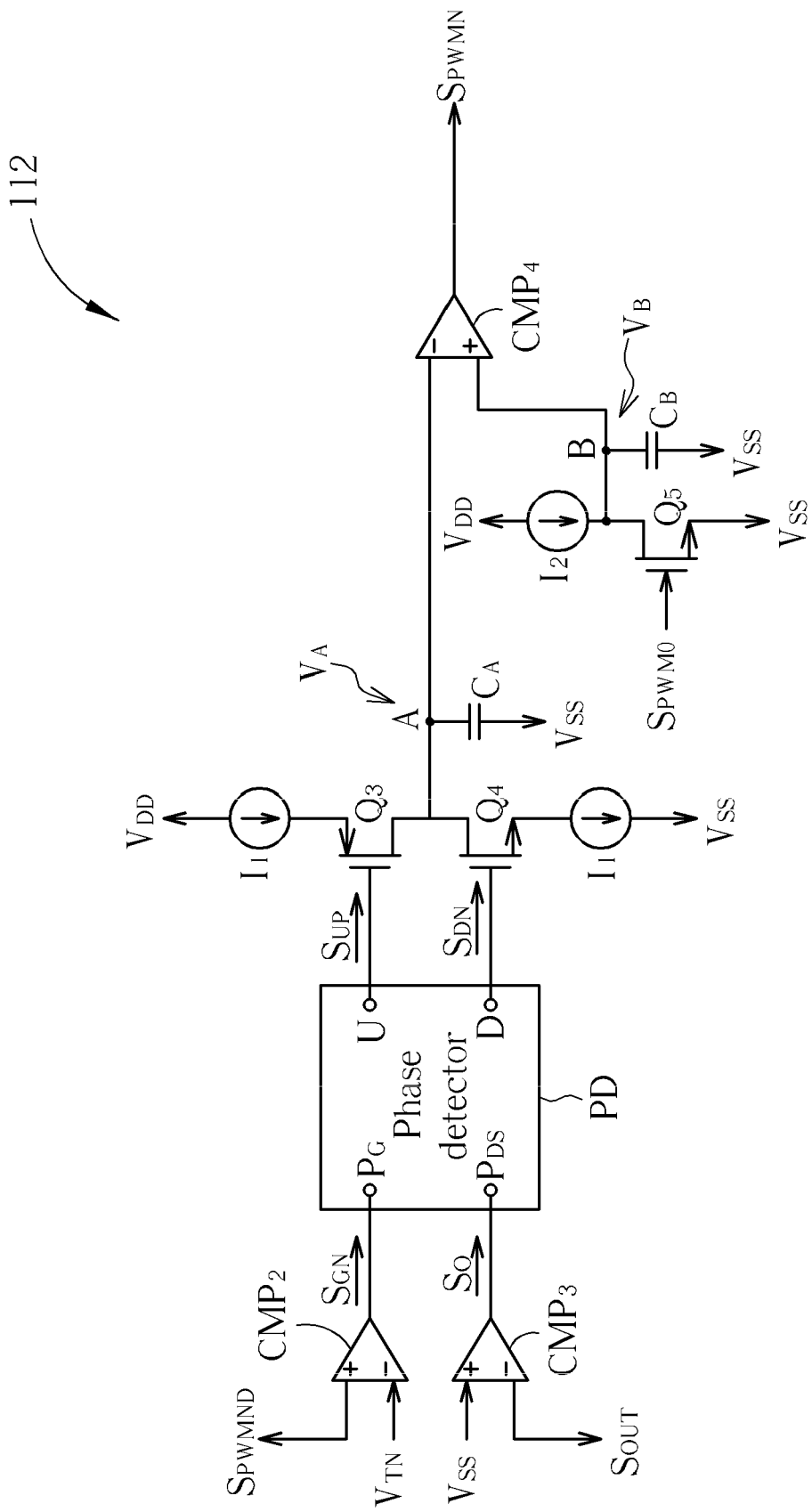
FIG. 3 is a diagram illustrating the rising dead-time locking circuit of the present invention.

Please refer to FIG. 3. FIG. 3 is a diagram illustrating the rising dead-time locking circuit 112 of the present invention. The operational principle of the rising dead-time locking circuit 112 is similar to the falling dead-time locking circuit 111, and hence the detail of the rising dead-time locking circuit 112 is not explained for brevity. The difference between the falling dead-time locking circuit 111 and the rising dead-time locking circuit 112 is explained as follows. In the rising dead-time locking circuit 112, the threshold voltage $V_{TH}$ received on the negative input end of the comparator $CMP_2$ is the threshold voltage of the transistor $Q_2$; the positive input end of the comparator $CMP_2$ is coupled to the output end of the gate driving circuit $GD_N$ for receiving the gate driving signal $S_{PWMND}$; the positive input end of the comparator $CMP_3$ is coupled to the voltage source $V_{SS}$; the negative input end of the comparator $CMP_3$ is coupled to the node Z for receiving the output signal $S_{OUT}$; the gate of the transistor $Q_5$ is coupled to the output end of the comparator $CMP_1$ for receiving the switching control signal $S_{PWM0}$; the result of the comparison of the comparator $CMP_4$ is directly served as the switch control signal $S_{PWMN}$ (an inverter is not required).

In this way, the rising dead-time locking circuit 112 is capable of detecting the phases of the gate driving signal $S_{PWMND}$ and the output signal $S_{OUT}$ with the phase detector PD for adjusting the timing of the occurrence of the signal with logic "1" outputted from the comparator $CMP_4$ by charging/discharging the capacitor $C_A$, and further adjusting the timing of the rising edge of the gate driving signal $S_{PWMND}$ for locking the rising dead-time to be a predetermined value.

Figure 4:
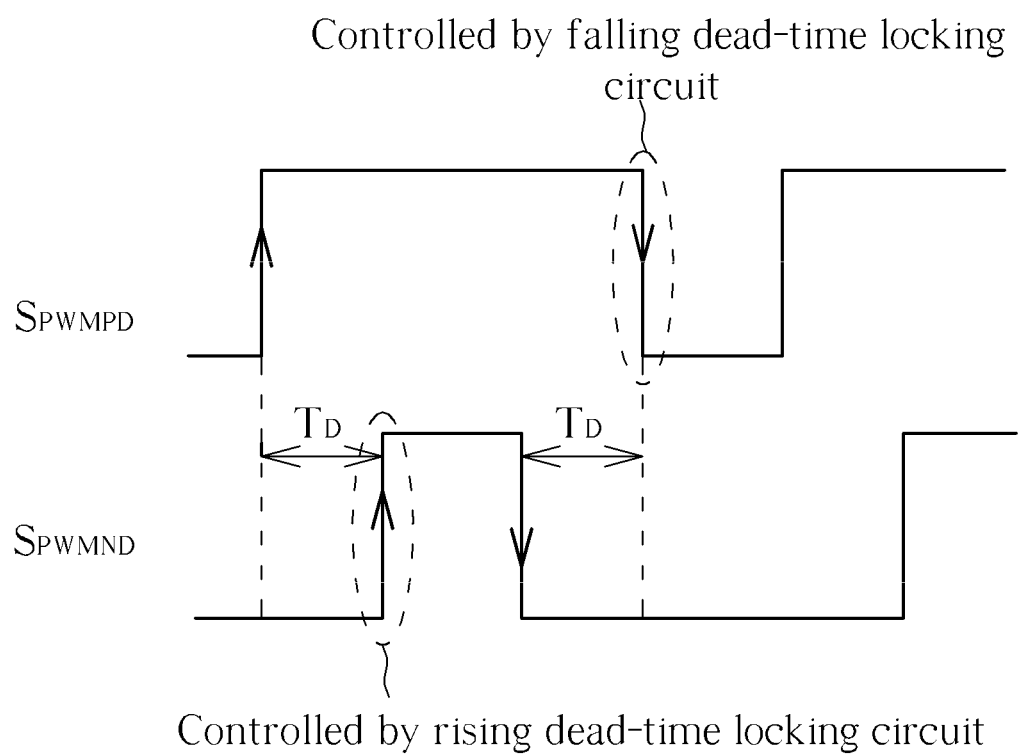
FIG. 4 is a timing diagram illustrating the gate driving signals of the present invention.

Please refer to FIG. 4. FIG. 4 is a timing diagram illustrating the gate driving signal of the present invention. As shown in FIG. 4, since the timing of rising edge of the gate driving signal $S_{PWMPD}$ and the timing of the falling edge of the gate driving signal $S_{PWMND}$ are decided by the switching control signal $S_{PWM0}$, and the switching control signal $S_{PWM0}$ is set as a fixed value, the timing of rising edge of the gate driving signal $S_{PWMPD}$ and the timing of the falling edge of the gate driving signal $S_{PWMND}$ can be fixed to a predetermined value accordingly. More particularly, the timing falling edge of the gate driving signal $S_{PWMPD}$ can be controlled or adjusted by the falling dead-time locking circuit 111 for locking the length of the dead-time to be $T_D$; similarly, the timing of the rising edge of the gate driving signal $S_{PWMND}$ can be controlled or adjusted by the rising dead-time locking circuit 112 for locking the length of the dead-time to be $T_D$. In this way, the dead-times between the gate driving signals $S_{PWMPD}$ and $S_{PWMND}$ can be detected all the time and locked to be a predetermined value. Therefore, the distortion of the output signal of the class D amplifier will not be deteriorated and the power transistors $Q_1$ and $Q_2$ will not be turned on at the same time, which avoids generation of the large transient current and excessive heat and protects the power transistors.

Furthermore, the predetermined length of dead-time is decided by the values of the capacitors $C_A$ and $C_B$ of the falling dead-time locking circuit 111 and the rising dead-time locking circuit 112 and the constant current source $I_2$. The users can design the length of the dead-time as desired. More particularly, the length $T_D$ of the dead-time is proportional to the magnitudes of the capacitors $C_A$ and $C_B$, and is inversely proportional to the magnitude of the constant current source $I_2$.

To sum up, the dead-time locking circuit provided by the present invention is capable of locking the required dead-time of the class D amplifier, and the locked dead-time is not affected by the process/temperature or the other related components and does not vary greatly. In this way, the distortion of output signal of the class D amplifier will not be deteriorated and the power transistors at the output stage of the class D amplifier will avoid being turned on at the same time, which creates a large transient current and damage to the related components, providing great convenience to users.

Those skilled in the art will readily observe that numerous modifications and alterations of the device and method may be made while retaining the teachings of the invention.

What is claimed is:

1. A dead-time locking circuit for controlling a class D amplifier, the dead-time locking circuit comprising:
    a first comparator, comprising:
        a positive input end for receiving a threshold voltage;
        a negative input end for receiving a gate driving signal; and
        an output end for outputting a first comparing signal;
        wherein the first comparing signal results from comparing the threshold voltage and the gate driving signal;
    a second comparator, comprising:
        a positive input end for receiving an output signal of the class D amplifier;
        a negative input end coupled to a first voltage source for receiving a first voltage; and
        an output end for outputting a second comparing signal;
        wherein the second comparing signal results from comparing the first voltage and the output signal of class D amplifier;
    a phase detector, comprising:
        a first input end coupled to output end of the first comparator for receiving the first comparing signal;
        a second input end coupled to the output end of the second comparator for receiving the second comparing signal;
        a first output end for outputting a phase-leading signal; and
        a second input end for outputting a phase-lagging signal;
        wherein when phase of the first comparing signal leads the phase of second comparing signal, the phase detector outputs the phase-leading signal; when the phase of the first comparing signal lags the phase of the second comparing signal, the phase detector outputs the phase-lagging signal;
    a first and a second current sources for providing a first current;
    a first transistor, comprising:
        a first end coupled to the first current source;
        a second end, and
        a control end coupled to the first output end of the phase detector;
        wherein when the first transistor receives the phase-leading signal, the first current is outputted at the second end of the first transistor;
    a second transistor, comprising:
        a first end coupled to the second current source;
        a second end coupled to the second end of the first transistor; and
        a control end coupled to the second output end of the phase detector;
        wherein when the second transistor receives the phase-lagging signal, the first current is drained at the second end of the second transistor;
    a first capacitor coupled between the second end of the first transistor, the second end of the second transistor, and a second voltage source;
    a third current source for providing a second current;
    a second capacitor coupled between the third current source and the second voltage source;

a third transistor, comprising:
  a first end coupled to the second voltage source;
  a second end coupled to the third current source and the second capacitor; and
  a control end for receiving a switching control signal;
  wherein when the switching control signal turns the third transistor on, the second current source discharges the second capacitor through the third transistor; when the switching control signal turns the third transistor off, the third current source charges the second capacitor; and
a third comparator, comprising:
  a positive input end coupled to the second capacitor;
  a negative input end coupled to the first capacitor;
  an output end for outputting a switch control signal;
  wherein the switch control signal results from comparing voltages of the first capacitor and the second capacitor.

2. The dead-time locking circuit of claim 1, wherein the class D amplifier comprises:
  a gate driving circuit coupled to the output end of the third comparator for receiving the switch control signal and amplifying accordingly for generating the gate driving signal;
  a power transistor comprising:
    a first end coupled to a third voltage source for receiving a third voltage;
    a second end for outputting the output signal of the class D amplifier; and
    a control end coupled to the gate driving circuit for receiving the gate driving signal;
    wherein the output signal of the class D amplifier is outputted according to the gate driving signal;
    wherein the threshold voltage is threshold voltage for turning on the power transistor;
    wherein the third voltage is the same as the first voltage; and
  a fourth comparator comprising:
    a positive input end for receiving a triangle waveform signal;
    a negative input end for receiving an audio signal;
    an output end for outputting the switching control signal;
    wherein the switching control signal results from comparing the triangle waveform signal and the audio signal.

3. The dead-time locking circuit of claim 2, wherein the class D amplifier further comprises a triangle waveform generator coupled to the positive input end of the fourth comparator for generating the triangle waveform signal.

4. The dead-time locking circuit of claim 2, wherein the class D amplifier further comprises a first inverter coupled between the output end of the fourth comparator and the control end of the third transistor.

5. The dead-time locking circuit of claim 4, further comprising a second inverter coupled between the output end of the third transistor and the gate driving circuit.

6. A dead-time locking circuit for controlling a class D amplifier, the dead-time locking circuit comprising:
  a falling dead-time locking circuit, comprising:
    a first comparator, comprising:
      a positive input end for receiving a first turning-on threshold voltage;
      a negative input end for receiving a first gate driving signal; and
      an output end for outputting a first comparing signal;
      wherein the first comparing signal results from comparing the first turning-on threshold voltage and the first gate driving signal;
    a second comparator, comprising:
      a positive input end for receiving an output signal of the class D amplifier;
      a negative input end coupled to a first voltage source for receiving a first voltage; and
      an output end for outputting a second comparing signal;
      wherein the second comparing signal results from comparing the first voltage and the output signal of the class D amplifier;
    a phase detector, comprising:
      a first input end coupled to output end of the first comparator for receiving the first comparing signal;
      a second input end coupled to the output end of the second comparator for receiving the second comparing signal;
      a first output end for outputting a phase-leading signal; and
      a second input end for outputting a phase-lagging signal;
      wherein when phase of the first comparing signal leads the phase of second comparing signal, the phase detector outputs the phase-leading signal; when the phase of the first comparing signal lags the phase of the second comparing signal, the phase detector outputs the phase-lagging signal;
    a first and a second current sources for providing a first current;
    a first transistor, comprising:
      a first end coupled to the first current source;
      a second end; and
      a control end coupled to the first output end of the phase detector;
      wherein when the first transistor receives the phase-leading signal, the first current is outputted at the second end of the first transistor;
    a second transistor, comprising:
      a first end coupled to the second current source;
      a second end coupled to the second end of the first transistor; and
      a control end coupled to the second output end of the phase detector;
      wherein when the second transistor receives the phase-lagging signal, the first current is drained at the second end of the second transistor;
    a first capacitor coupled between the second end of the first transistor, the second end of the second transistor, and a second voltage source;
    a third current source for providing a second current;
    a second capacitor coupled between the third current source and the second voltage source;
    a third transistor, comprising:
      a first end coupled to the second voltage source;
      a second end coupled to the third current source and the second capacitor; and
      a control end for receiving an inverted signal of a switch control signal;
      wherein when the inverted signal of the switching control signal turns the third transistor on, the second current source discharges the second capacitor through the third transistor; when the inverted signal of the switching control signal turns the third transistor off, the third current source charges the second capacitor; and a third comparator, comprising:
  a positive input end coupled to the second capacitor;
  a negative input end coupled to the first capacitor;
  an output end for outputting a result of comparing voltages respectively on the first capacitor and the second capacitor; and
  an inverter coupled to the output end of the third comparator for inverting a received signal as a first switch control signal; and a rising dead-time locking circuit, comprising:
  a first comparator, comprising:
    a negative input end for receiving a second turning-on threshold voltage;
    a positive input end for receiving a second gate driving signal; and
    an output end for outputting a first comparing signal;
    wherein the first comparing signal results from comparing the second turning-on threshold voltage and the second gate driving signal;
  a second comparator, comprising:
    a negative input end for receiving the output signal of the class D amplifier;
    a positive input end coupled to the second voltage source for receiving a second voltage; and
    an output end for outputting a second comparing signal;
    wherein the second comparing signal results from comparing the second voltage and the output signal of the class D amplifier;
  a phase detector, comprising:
    a first input end coupled to output end of the first comparator for receiving the first comparing signal;
    a second input end coupled to the output end of the second comparator for receiving the second comparing signal;
    a first output end for outputting a phase-leading signal; and
    a second input end for outputting a phase-lagging signal;
    wherein when phase of the first comparing signal leads the phase of second comparing signal, the phase detector outputs the phase-leading signal; when the phase of the first comparing signal lags the phase of the second comparing signal, the phase detector outputs the phase-lagging signal;
  a first and a second current sources for providing a first current;
  a first transistor, comprising:
    a first end coupled to the first current source;
    a second end; and
    a control end coupled to the first output end of the phase detector;
    wherein when the first transistor receives the phase-leading signal, the first current is outputted at the second end of the first transistor;
  a second transistor, comprising:
    a first end coupled to the second current source;
    a second end coupled to the second end of the first transistor; and
    a control end coupled to the second output end of the phase detector;
    wherein when the second transistor receives the phase-lagging signal, the first current is drained at the second end of the second transistor;
  a first capacitor coupled between the second end of the first transistor, the second end of the second transistor, and the second voltage source;
  a third current source for providing the second current;
  a second capacitor coupled between the third current source and the second voltage source;
  a third transistor, comprising:
    a first end coupled to the second voltage source;
    a second end coupled to the third current source and the second capacitor; and
    a control end for receiving a switching control signal;
    wherein when the switching control signal turns the third transistor on, the second current source discharges the second capacitor through the third transistor; when the switching control signal turns the third transistor off, the third current source charges the second capacitor; and
  a third comparator, comprising:
    a positive input end coupled to the second capacitor;
    a negative input end coupled to the first capacitor; and
    an output end for outputting a result of comparing voltages respectively on the first capacitor and the second capacitor as a second switch control signal.

7. The dead-time locking circuit of claim 6, wherein the class D amplifier comprises:
  a first gate driving circuit coupled to output end of the third comparator of the falling dead-time locking circuit for receiving the first switch control signal and accordingly amplifying so as to generate the first gate driving signal;
  a first power transistor, comprising:
    a first end coupled to the first voltage source for receiving the first voltage;
    a second end for outputting the output signal of the class D amplifier; and
    a control end coupled to the first gate driving circuit for receiving the first gate driving signal;
    wherein the output signal of the class D amplifier is outputted according to the first gate driving signal;
    wherein the first threshold voltage is threshold voltage for turning on the first power transistor;
  a second gate driving circuit coupled to output end of the third comparator of the rising dead-time locking circuit for receiving the second switch control signal and accordingly amplifying so as to generate the second gate driving signal;
  a second power transistor, comprising:
    a first end coupled to the second voltage source for receiving the second voltage;
    a second end coupled to the second end of the first power transistor for outputting the output signal of the class D amplifier; and
    a control end coupled to the second gate driving circuit for receiving the second gate driving signal;
    wherein the output signal of the class D amplifier is outputted according to the second gate driving signal;
    wherein the second threshold voltage is threshold voltage for turning on the second power transistor;
  a fourth comparator, comprising:
    a positive input end for receiving a triangle waveform signal;
    a negative input end for receiving an audio signal;
    an output end for outputting the switching control signal;

wherein the switching control signal results from comparing the triangle waveform signal and the audio signal; and a second inverter coupled between the output end of the fourth comparator and the control end of the third transistor of the falling dead-time locking circuit.

8. The dead-time locking circuit of claim 7, wherein the class D amplifier further comprises a triangle waveform generator coupled to the positive input end of the fourth comparator for generating the triangle waveform signal.

* * * * *